United States Patent
Lee et al.

(10) Patent No.: US 9,424,904 B2
(45) Date of Patent: Aug. 23, 2016

(54) MAGNETIC MEMORY DEVICES INCLUDING OXIDE MULTIFERROIC MATERIAL

(71) Applicants: Kilho Lee, Hwaseong-si (KR); Sangyong Kim, Suwon-si (KR); Woojin Kim, Seoul (KR); KyungTae Nam, Suwon-si (KR)

(72) Inventors: Kilho Lee, Hwaseong-si (KR); Sangyong Kim, Suwon-si (KR); Woojin Kim, Seoul (KR); KyungTae Nam, Suwon-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 39 days.

(21) Appl. No.: 14/526,489

(22) Filed: Oct. 28, 2014

(65) Prior Publication Data
US 2015/0228321 A1    Aug. 13, 2015

(30) Foreign Application Priority Data
Feb. 11, 2014 (KR) .................. 10-2014-0015615

(51) Int. Cl.
G11C 11/02 (2006.01)
G11C 11/16 (2006.01)
G11C 11/22 (2006.01)

(52) U.S. Cl.
CPC .......... *G11C 11/161* (2013.01); *G11C 11/1675* (2013.01); *G11C 11/221* (2013.01)

(58) Field of Classification Search
CPC G11C 11/161; G11C 11/1675; G11C 11/221
USPC ....................................... 365/158
See application file for complete search history.

(56) References Cited

U.S. PATENT DOCUMENTS

| 7,573,734 B2 | 8/2009 | Grino et al. |
| 7,656,700 B2 | 2/2010 | Seigler |
| 7,719,883 B2 | 5/2010 | Hochstrat et al. |
| 8,189,370 B2 | 5/2012 | Hayakawa |

(Continued)

FOREIGN PATENT DOCUMENTS

| JP | 5379675 B | 7/2011 |
| JP | 5166600 | 3/2013 |
| KR | 20120021784 A | 3/2012 |

OTHER PUBLICATIONS

T. Zhao et al, "Electrical control of antiferromagnetic domains in multiferroic BiFeO3 films at room temperature", Nature Publishing Group 2006, vol. 5, Oct. 2006, pp. 823-829.

(Continued)

*Primary Examiner* — Xiaochun L Chen
(74) *Attorney, Agent, or Firm* — Renaissance IP Law Group LLP

(57) ABSTRACT

A magnetic memory device is provided. The magnetic memory device includes a plurality of variable resistance devices connected to a word line, and a plurality of bit lines, each of which provides an electrical pathway between a corresponding one of the variable resistance devices and a read and write circuit. Each of the variable resistance devices includes a free layer and a pinned layer spaced apart from each other and having a tunnel barrier interposed therebetween, an assistant layer spaced apart from the tunnel barrier and having the free layer interposed therebetween, and an exchange coupling layer arranged between the free layer and the assistant layer. The exchange coupling layer has an electric polarization, which results from its ferroelectric property, and having a direction that can be changed by a voltage applied to the corresponding one of the bit lines.

19 Claims, 12 Drawing Sheets

(56) References Cited

U.S. PATENT DOCUMENTS

| | | | |
|---|---|---|---|
| 8,310,861 B2* | 11/2012 | Liu | G11C 11/16 257/421 |
| 9,007,820 B2* | 4/2015 | Bibes | H01L 43/08 365/158 |
| 2009/0016097 A1 | 1/2009 | Grino et al. | |
| 2009/0067224 A1 | 3/2009 | Hochstrat et al. | |
| 2009/0073747 A1 | 3/2009 | Seigler | |
| 2010/0080048 A1* | 4/2010 | Liu | G11C 11/16 365/157 |
| 2011/0134689 A1 | 6/2011 | Hayakawa | |
| 2012/0300543 A1* | 11/2012 | Ohno | H01F 10/3254 365/171 |
| 2014/0043895 A1* | 2/2014 | Bibes | H01L 43/08 365/171 |

OTHER PUBLICATIONS

Y. H. Chu et al, "Low voltage performance of epitaxial BiFeO3 films on Si substrates through lanthanum substitution", Applied Physics Letters 92, 2008 American Institute of Physics, pp. 102909-1 through 102909-3.

* cited by examiner

MAGNETIC MEMORY DEVICES INCLUDING OXIDE MULTIFERROIC MATERIAL

CROSS-REFERENCE TO RELATED APPLICATIONS

This U.S. non-provisional patent application claims priority under 35 U.S.C. §119 to Korean Patent Application No. 10-2014-0015615, filed on Feb. 11, 2014, in the Korean Intellectual Property Office, the entire contents of which are hereby incorporated by reference.

BACKGROUND OF THE INVENTION

Example embodiments of the inventive concepts relate to a magnetic memory device, and in particular, to a magnetic memory device with a magnetic tunnel junction.

Due to demand for electronic devices with increased speed and/or reduced power consumption, semiconductor devices may require faster operating speeds and/or lower operating voltages. Magnetic memory devices have been suggested to satisfy such requirements. For example, a magnetic memory device can provide technical advantages, such as reduced latency and/or non-volatility. As a result, magnetic memory devices are emerging as next-generation memory devices.

A magnetic memory device may include a magnetic tunnel junction (MTJ). A magnetic tunnel junction may include two magnetic layers and a tunnel barrier layer interposed therebetween. Resistance of the magnetic tunnel junction may vary depending on magnetization orientations of the magnetic layers. For example, the resistance of the magnetic tunnel junction may be higher when the magnetic layers have anti-parallel magnetization orientations than when they have parallel magnetization orientations. Such a difference in resistance can be used for data storing operations of a magnetic memory device. However, more research is still needed to mass-produce magnetic memory devices.

SUMMARY

Example embodiments of the inventive concepts provide a magnetic tunnel junction (MTJ) with high stability and improved switching properties and further include a highly-reliable magnetic memory device with the MTJ.

According to example embodiments of the inventive concepts, a magnetic memory device may include a plurality of variable resistance devices connected to a word line, and a plurality of bit lines, each of which provides an electrical pathway between a corresponding one of the variable resistance devices and a read and write circuit. Each of the bit lines may be connected to a corresponding one of the variable resistance devices, and each of the variable resistance devices may include a free layer and a pinned layer spaced apart from each other with a tunnel barrier interposed therebetween, an assistant layer spaced apart from the tunnel barrier with the free layer interposed therebetween, and an exchange coupling layer arranged between the free layer and the assistant layer. The exchange coupling layer may have an electric polarization, which results from its ferroelectric property, with a direction that can be changed by a voltage applied to a corresponding one of the bit lines.

In example embodiments, the electric polarization may have a first direction, and, when a write voltage is applied to the corresponding one of the bit lines, the electric polarization may be changed to have a second direction different from the first direction.

In example embodiments, the exchange coupling layer may have magnetic moments, which result from its antiferromagnetic property, and whose directions can be changed by a voltage applied to the corresponding one of the bit lines.

In example embodiments, the magnetic moments may have a third direction that is arranged at a specific angle with respect to the first direction, and when a write voltage is applied to the corresponding one of the bit lines, the magnetic moments may be changed to have a fourth direction, which is different from the third direction and is arranged at the specific angle with respect to the second direction.

In example embodiments, the exchange coupling layer may include a multiferroic material with ferroelectric and antiferromagnetic properties.

In example embodiments, the exchange coupling layer may include $BiFeO_3$.

In example embodiments, each of the variable resistance devices may further include an electrode layer spaced apart from the exchange coupling layer with the assistant layer interposed therebetween, and the assistant layer may further include at least one of a conductive metal oxide or a metal.

In example embodiments, the exchange coupling layer may include an oxide multiferroic material with a Perovskite structure, and the assistant layer may include at least one of a conductive metal oxide with a Perovskite structure, a metal with a face centered cubic structure, or a metal with a body centered cubic structure.

In example embodiments, the assistant layer may include at least one of $SrRuO_3$, Pt, or W.

In example embodiments, the assistant layer may have a thickness larger than that of the exchange coupling layer.

In example embodiments, the exchange coupling layer may, for instance, have two opposing surfaces that are in contact with the free and assistant layers, respectively.

In example embodiments, each of the variable resistance devices may be provided on a substrate, and each of the free and pinned layers may have a magnetization direction substantially perpendicular to a top surface of the substrate.

In example embodiments, the electric polarization may have a direction that is substantially parallel to a top surface of the free layer, and the direction of the electric polarization may be changed to be at an oblique angle to the top surface of the free layer, when a write voltage is applied to the corresponding one of the bit lines.

In example embodiments, each of the variable resistance devices may be provided on a substrate, and each of the free and pinned layers may have a magnetization direction substantially parallel to a top surface of the substrate.

In example embodiments, the electric polarization may have a direction that is substantially perpendicular to a top surface of the free layer, and the direction of the electric polarization may be changed to be at an oblique angle to the top surface of the free layer, when a write voltage is applied to the corresponding one of the bit lines.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
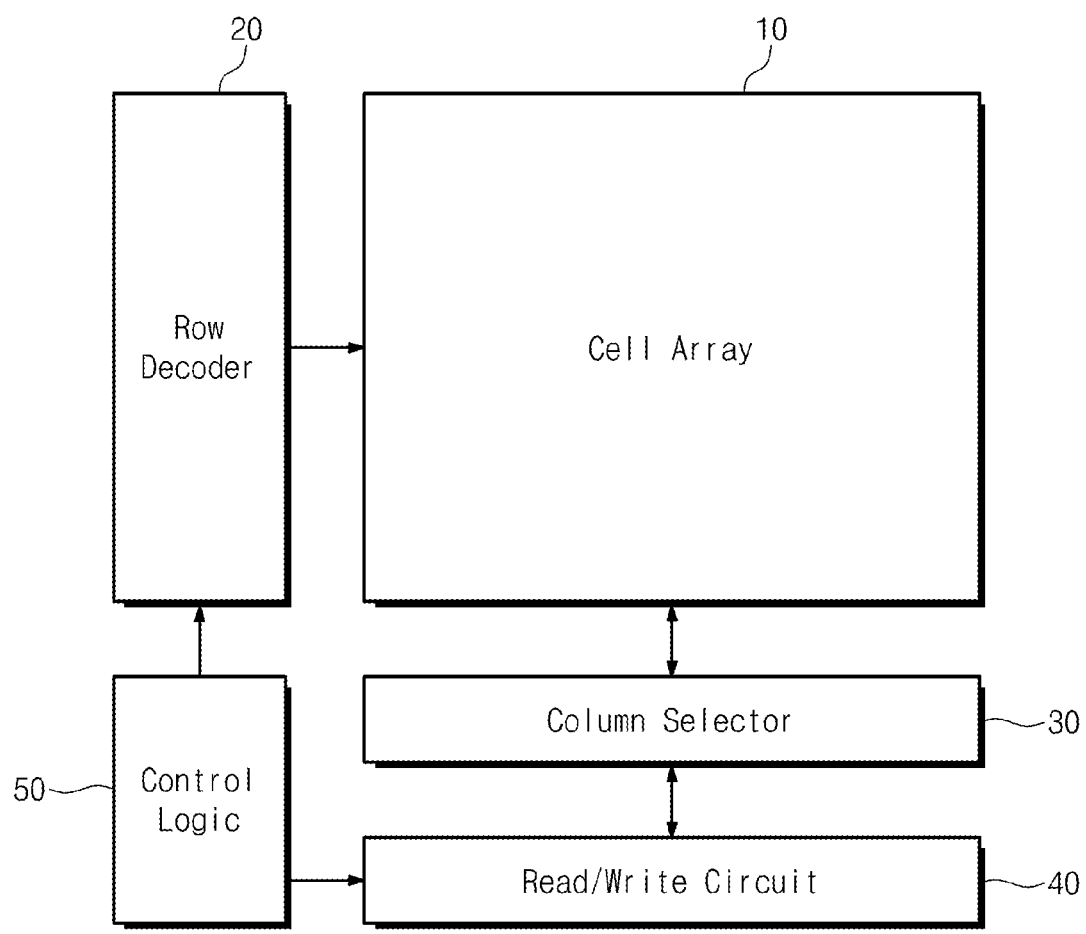
FIG. 1 is a block diagram of a magnetic memory device according to example embodiments of the inventive concepts.

It should be noted that these figures are intended to illustrate the general characteristics of methods, structures, and/or materials utilized in certain example embodiments and to supplement the written description provided below. These drawings are not, however, to scale and may not reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of similar or identical elements or features.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions may be exaggerated for clarity. Like reference numerals in the drawings denote like elements, and redundant description thereof may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," and "on" versus "directly on").

It will be understood that, although the terms "first", "second", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (i.e., rotated 90 degrees or at other orientations) and the spatially relative descriptors used herein interpreted accordingly.

The terminology used herein is for the purpose of describing particular embodiments only and is not intended to be limiting of the inventive concepts. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments of the inventive concepts are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments of the inventive concepts should not be construed as limited to the particular shapes of regions illustrated herein, but are to include deviations in shapes that result, for example, from manufacturing. For example, an implanted region illustrated as a rectangle may have rounded or curved features, and/or a gradient of implant concentration at its edges, rather than a binary change from implanted to non-implanted region. Likewise, a buried region formed by implantation may result in some implantation in the region between the buried region and the surface through which the implantation takes place. Thus, the regions illustrated in the figures are schematic in nature, and their shapes are not intended to illustrate the actual shape of a region of a device, and are further not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated into the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array, and/or in a two-dimensional pattern, that is based on the intended functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional views illustrated herein provide support for a plurality of devices that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and should not be interpreted in an idealized or overly formal sense unless expressly so defined herein.

FIG. 1 is a block diagram of a magnetic memory device according to example embodiments of the inventive concepts.

Referring to FIG. 1, a magnetic memory device may include a memory cell array (Cell Array) 10, a row decoder 20, a column selection circuit (Column Selector) 30, a read and write circuit (Read/Write Circuit) 40, and control logic 50.

The memory cell array 10 may include a plurality of word lines, a plurality of bit lines, and a plurality of memory cells provided at intersections between the word and bit lines. The structure of the memory cell array 10 will be described below with reference to FIG. 2.

The row decoder 20 may be connected to the memory cell array 10 through the word lines. The row decoder 20 may be configured to decode address information input from the outside and thereby to select one of the word lines.

The column selection circuit 30 may be connected to the memory cell array 10 through the bit lines and may be configured to decode address information input from the outside to thereby select one of the bit lines. The bit line selected by the column selection circuit 30 may be connected to the read and write circuit 40.

The read and write circuit 40 may provide a bit line bias for accessing the selected memory cell, in response to control signals from the control logic 50. Further, the read and write circuit 40 may provide the bit line voltage to the selected bit line for writing or reading data to or from the memory cell.

The control logic 50 may output control signals for controlling the semiconductor memory device, in response to command signals input from the outside. The control signals output from the control logic 50 may be used to control the read and write circuit 40.

Figure 2:
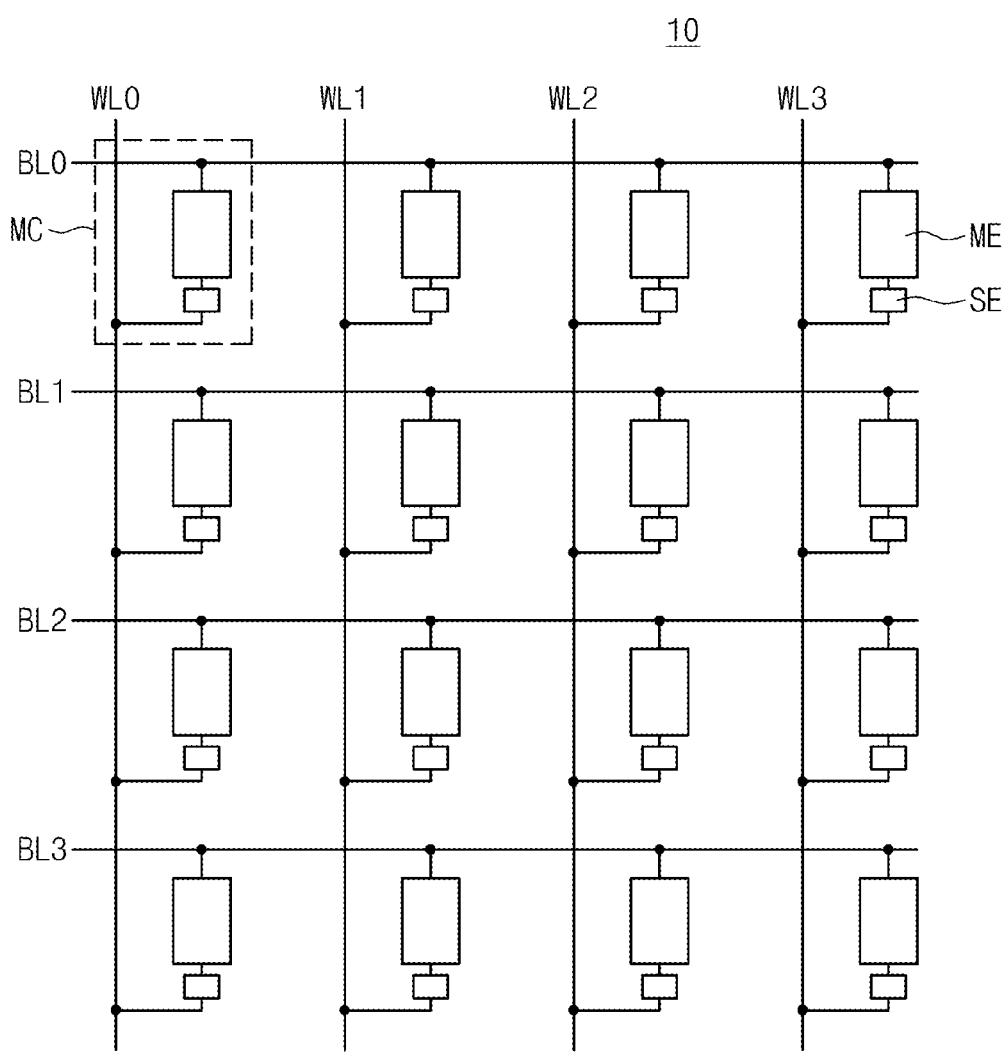
FIG. 2 is a circuit diagram of a memory cell array of a magnetic memory device according to example embodiments of the inventive concepts.
Figure 3:
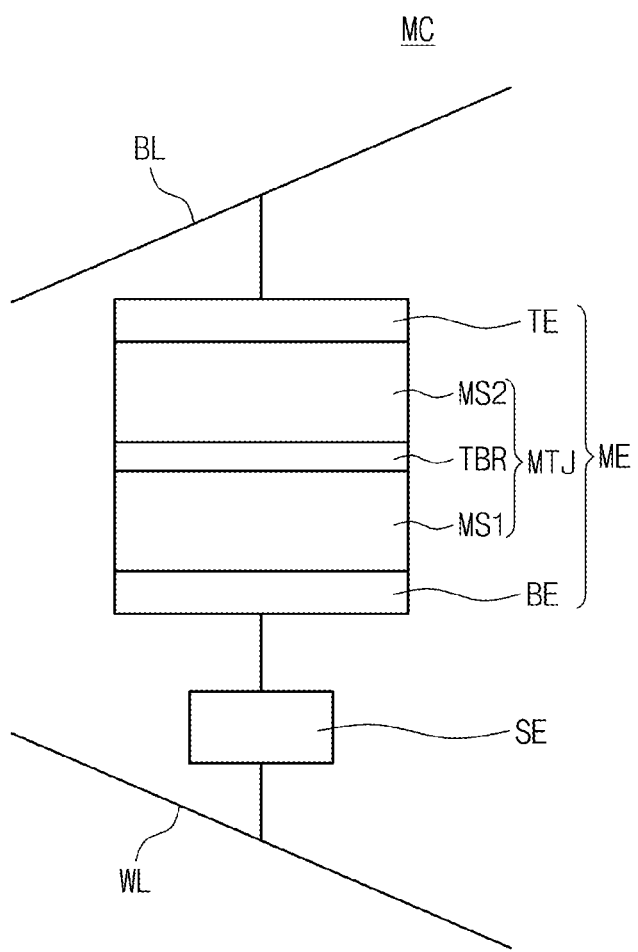
FIG. 3 is a circuit diagram illustrating a unit memory cell of a magnetic memory device according to example embodiments of the inventive concepts.

FIG. 2 is a circuit diagram of a memory cell array of a magnetic memory device according to example embodiments of the inventive concepts, and FIG. 3 is a circuit diagram illustrating a unit memory cell of a magnetic memory device according to example embodiments of the inventive concepts.

Referring to FIG. 2, the memory cell array 10 may include a plurality of first conductive lines, a plurality of second conductive lines, and a plurality of unit memory cells MC. In example embodiments, the first conductive lines may serve as word lines WL0-WL3, and the second conductive lines may serve as bit lines BL0-BL3. The unit memory cells MC may be two- or three-dimensionally arranged. The word lines WL and the bit lines BL may be provided to cross each other, and each of the unit memory cells MC may be provided at a corresponding one of intersections between the word lines WL and the bit lines BL. Each of the word lines WL may be connected to a plurality of unit memory cells MC. The plurality of unit memory cells MC connected to one of the word line WL may be connected to corresponding ones of the bit lines BL, respectively. In other words, each of the bit lines BL may be connected to a corresponding one of the unit memory cells MC connected to a word line WL. The unit memory cells MC may be connected to the read and write circuit 40, described with reference to FIG. 1, through corresponding ones of the bit lines BL.

Referring to FIG. 3, each of the unit memory cells MC may include a memory device ME and a selection device SE. The memory device ME may be provided between the bit line BL and the selection device SE, and the selection device SE may be provided between the memory device ME and the word line WL. The memory device ME may be a variable resistance device, whose resistance can be switched to one of at least two values, depending on an electric pulse applied thereto.

In example embodiments, the memory device ME may be formed to have a layered structure, whose electric resistance can by changed by a spin transfer process using an electric current passing therethrough. For example, the memory device ME may have a layered structure configured to exhibit a magneto-resistance property and may include at least one ferromagnetic material and/or at least one antiferromagnetic material.

The selection device SE may be configured to selectively control an electric current passing through the memory device ME. For example, the selection device SE may be one of a diode, a pnp bipolar transistor, an npn bipolar transistor, an NMOS (n-channel metal-oxide-semiconductor) field effect transistor (FET), and a PMOS (p-channel metal-oxide-semiconductor) FET. When the selection device SE is a three-terminal switching device, such as a bipolar transistor or a MOSFET, an additional interconnection line may be connected to a control electrode or gate of the selection device SE.

The memory device ME may include, for example, a first magnetic structure MS1, a second magnetic structure MS2, and a tunnel barrier TBR therebetween. In example embodiments, the first magnetic structure MS1, the second magnetic structure MS2, and the tunnel barrier TBR may constitute a magnetic tunnel junction MTJ pattern. Each of the first and second magnetic structures MS1 and MS2 may include at least one magnetic layer made of a magnetic material. The memory device ME may include a lower electrode BE interposed between the first magnetic structure MS1 and the selection device SE, and an upper electrode TE interposed between the second magnetic structure MS2 and the bit line BL.

FIGS. 4A through 4D are schematic diagrams illustrating magnetic tunnel junctions (MTJs) according to example embodiments of the inventive concepts.

Referring to FIGS. 4A through 4D, one of the magnetic layers of the first and second magnetic structures MS1 and MS2 may be configured to have a fixed magnetization direction, which is not changed by an external magnetic field generated under usual environments. In the present specification, for convenience in description, the term "pinned layer PNL" will be used to refer to the magnetic layer having a fixed magnetization property (also referred to as a pinned magnetic structure). By contrast, the other magnetic layer of the first and second magnetic structures MS1 and MS2 may be configured to have a magnetization direction which can be switched by applying an external magnetic field thereto. Hereinafter, the term "free layer FRL" will be used to refer to a magnetic layer having a switchable magnetization property. For example, the magnetic tunnel junction MTJ may include at least one free layer FRL and at least one pinned layer PNL separated from each other by the tunnel barrier TBR.

Electrical resistance of the magnetic tunnel junction MTJ may be sensitive to a relative orientation of magnetization directions of the free and pinned layers FRL and PNL, respectively. For example, the electrical resistance of the magnetic tunnel junction MTJ may be far greater when the relative orientation is antiparallel than when the relative orientation is parallel. This means that the electrical resistance of the magnetic tunnel junction MTJ can be controlled by changing the magnetization direction of the free layer FRL. Magnetic memory devices according to example embodiments of the inventive concepts may be realized based on this data storing mechanism.

The first and second magnetic structures MS1 and MS2 may be sequentially disposed on a substrate 100. In this case, the magnetic tunnel junction MTJ may be generally classified into four types, according to a relative configuration between the free layer FRL and the substrate 100, and/or based on a forming order of and a relative orientation of magnetization between the free and pinned layers FRL and PNL.

Figure 4A:
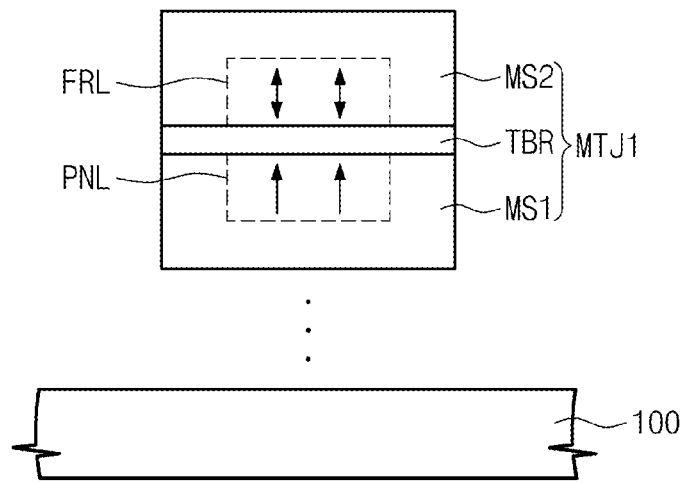
FIGS. 4A through 4D are schematic diagrams illustrating magnetic tunnel junctions (MTJs) according to example embodiments of the inventive concepts.
Figure 4B:
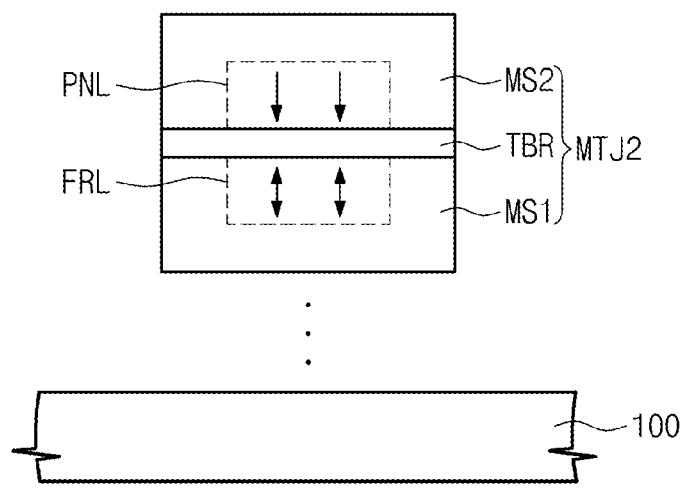

For example, each of the first and second magnetic structures MS1 and MS2 may include at least one magnetic layer, whose magnetization direction is substantially perpendicular to a top surface of the substrate 100. In this case, the magnetic tunnel junction MTJ may be a first type of magnetic tunnel junction MTJ1 configured with the first and second magnetic structures MS1 and MS2 including the pinned and free layers PNL and FRL, respectively, as shown in FIG. 4A, or a second type of magnetic tunnel junction MTJ2 configured with the first and second magnetic structures MS1 and MS2 including the free and pinned layers FRL and PNL, respectively, as shown in FIG. 4B.

Figure 4C:
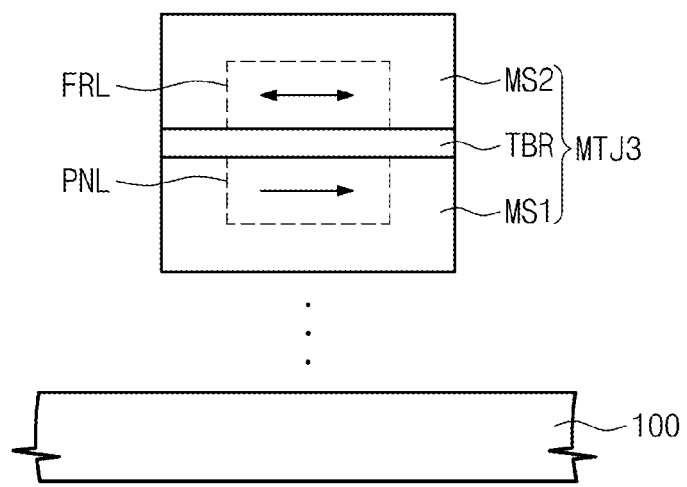
Figure 4D:
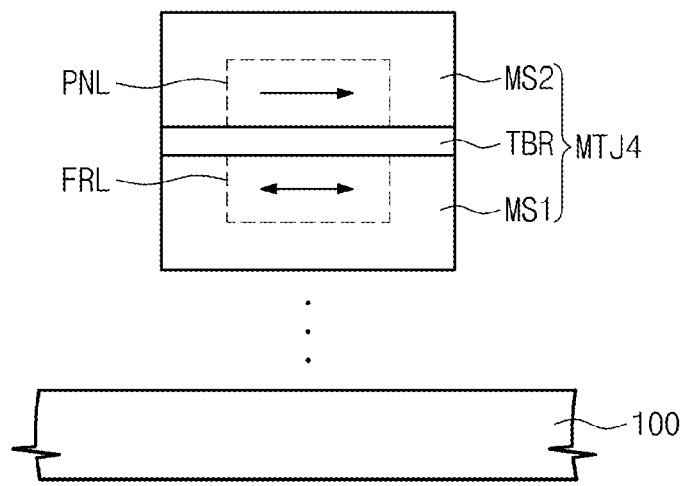

In addition, each of the first and second magnetic structures MS1 and MS2 may include at least one magnetic layer, whose magnetization direction is substantially parallel to the top surface of the substrate 100. In this case, the magnetic tunnel junction MTJ may be a third type of magnetic tunnel junction MTJ3 configured with the first and second magnetic structures MS1 and MS2 including the pinned and free layers PNL and FRL, respectively, as shown in FIG. 4C, or a fourth type of magnetic tunnel junction MTJ4 configured with the first and second magnetic structures MS1 and MS2 including the free and pinned layers FRL and PNL, respectively, as shown in FIG. 4D.

Figure 5:
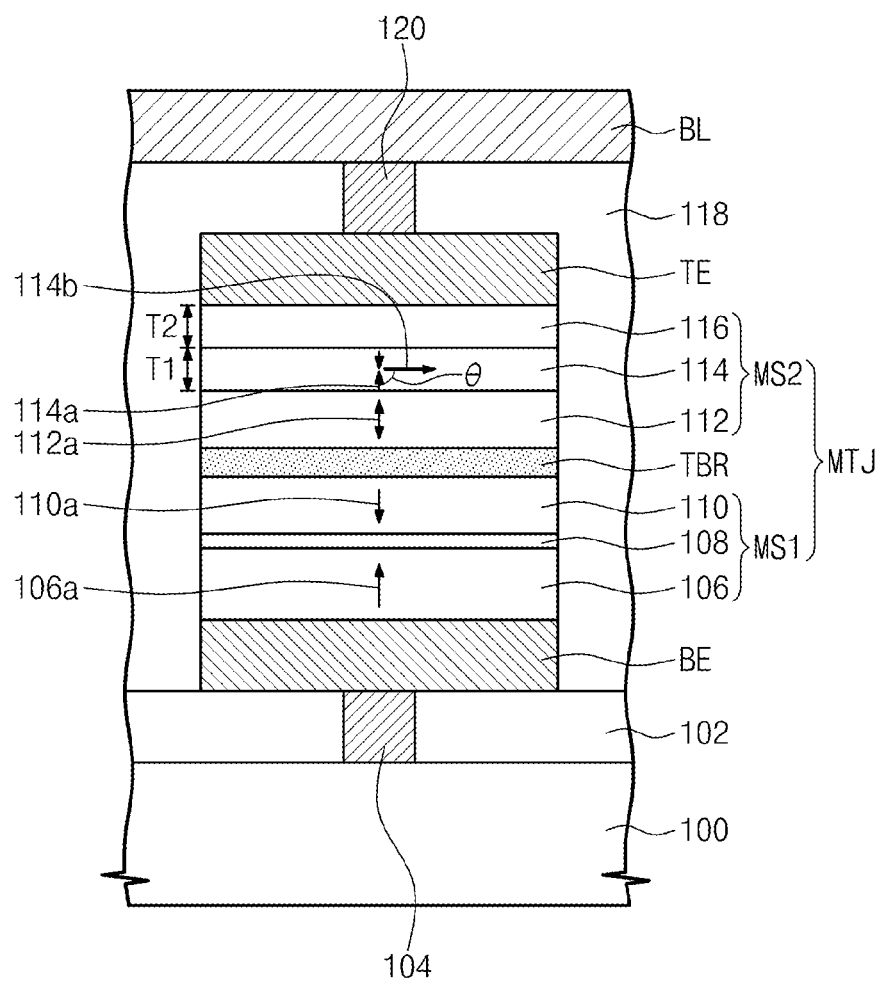
FIG. 5 is a sectional view illustrating a magnetic memory device according to example embodiments of the inventive concepts.

FIG. 5 is a sectional view illustrating a magnetic memory device according to example embodiments of the inventive concepts.

Referring to FIG. 5, a first dielectric layer 102 may be provided on a substrate 100, and a lower contact plug 104 may be provided penetrating through the first dielectric layer 102. A bottom surface of the lower contact plug 104 may be electrically connected to one terminal of the selection device. The substrate 100 may be formed of, or include, for example, one or more of semiconductor materials, insulating materials, or semiconductor or conductive materials covered with an insulating layer. For example, the substrate 100 may be a silicon wafer. The first dielectric layer 102 may include oxide, nitride, and/or oxynitride. The lower contact plug 104 may include one or more conductive materials, such as doped semiconductor materials (e.g., doped silicon, doped germanium, or doped silicon-germanium), metals (e.g., titanium, tantalum, or tungsten), and/or conductive metal nitrides (e.g., titanium nitride, tantalum nitride).

The lower electrode BE, the magnetic tunnel junction MTJ, and the upper electrode TE may be sequentially stacked on the first dielectric layer 102. The lower electrode BE may be electrically coupled to a top surface of the lower contact plug 104. The magnetic tunnel junction MTJ may include the first magnetic structure MS1 provided on the lower electrode BE, the second magnetic structure MS2 provided on the first magnetic structure MS1, and the tunnel barrier TBR arranged between the first magnetic structure MS1 and the second magnetic structure MS2. For example, the first magnetic structure MS1 may be disposed between the lower electrode BE and the tunnel barrier TBR, and the second magnetic structure MS2 may be disposed between the tunnel barrier TBR and the upper electrode TE.

The lower electrode BE may include a conductive metal nitride such as titanium nitride and/or tantalum nitride. The upper electrode TE may include at least one of tantalum (Ta), aluminum (Al), copper (Cu), gold (Au), silver (Ag), titanium (Ti), and/or conductive metal nitrides (e.g., titanium nitride or tantalum nitride).

In example embodiments, the first magnetic structure MS1 may include a first pinned layer 106 between the lower electrode BE and the tunnel barrier TBR, a second pinned layer 110 between the first pinned layer 106 and the tunnel barrier TBR, and a first exchange coupling layer 108 between the first pinned layer 106 and the second pinned layer 110. The first magnetic structure MS1 in the present embodiment may be a multi-layered magnetic structure that is configured to include the pinned layer PNL of the first type of magnetic tunnel junction MTJ1 described with reference to FIG. 4A. Accordingly, the first and second pinned layers 106 and 110, respectively, may have magnetization directions 106a and 110a, respectively, that are substantially perpendicular to the top surface of the substrate 100.

The first pinned layer 106 may be formed of a magnetic material exhibiting an intrinsic perpendicular magnetization property (hereinafter, referred as to a "perpendicular magnetization material"). Here, the intrinsic perpendicular magnetization property means that a magnetization direction of a magnetic layer is oriented parallel to its thickness direction, or perpendicular to its main surface, when there is no external magnetic field applied thereto. For example, when a magnetic layer with the perpendicular magnetization property is formed on a substrate, a magnetization direction of the magnetic layer may be substantially perpendicular to the top surface of the substrate 100.

The intrinsic perpendicular magnetization property of the first pinned layer 106 may be realized, for instance, by a single-layered or multi-layered structure including at least one cobalt-containing perpendicular magnetization material. In example embodiments, the first pinned layer 106 may be a single-layered or multi-layered structure including at least one of a cobalt-platinum alloy or a cobalt-platinum alloy with an added element X, where the element X may be at least one of boron, ruthenium, chromium, tantalum, and/or oxide. In other embodiments, the first pinned layer 106 may be provided in the form of a multi-layered structure, in which cobalt-containing layers and precious metal layers are alternatingly and repeatedly stacked. In this case, the cobalt-containing layers may, for instance, be formed of at least one of cobalt, cobalt iron, cobalt nickel, and/or cobalt chromium, and the precious metal layers may, for instance, be formed of platinum and/or palladium. In still other example embodiments, the first pinned layer 106 may be a multi-layered structure including at least one of the cobalt-platinum alloys or the cobalt-platinum alloys added with the element X and at least one of cobalt, cobalt iron, cobalt nickel, cobalt chromium, platinum, and/or palladium.

The above intrinsic perpendicular magnetization materials for the first pinned layer 106 are identified to provide a better understanding of inventive concepts, but the inventive concepts are not limited thereto. For example, the first pinned layer 106 may include at least one of: a) CoFeTb, in which the relative content of Tb is 10% or more; b) CoFeGd, in which the relative content of Gd is 10% or more; c) CoFeDy; d) FePt with an $L1_0$ structure; e) FePd with an $L1_0$ structure; f) CoPd with the an structure; g) CoPt with an $L1_0$ or $L1_1$ structure; h) CoPt with a hexagonal close packing (HCP) structure; i) alloys containing at least one of the materials identified in listings a) to h) above; and/or j) a multi-layered structure including magnetic and non-magnetic layers alternatingly stacked.

The multi-layered structure including the alternatingly-stacked magnetic and non-magnetic layers may include at least one of (Co/Pt)n, (CoFe/Pt)n, (CoFe/Pd)n, (CoP)n, (Co/Ni)n, (CoNi/Pt)n, (CoCr/Pt)n, and/or (CoCr/Pd)n, where n denotes the number of stacked structures. In certain embodiments, the first pinned layer 106 may further include a cobalt layer or a cobalt-rich layer disposed in contact with the first exchange coupling layer 108.

The first exchange coupling layer 108 may be formed of at least one of ruthenium, iridium, and/or rhodium. According to example embodiments of the inventive concepts, the second pinned layer 110 may be antiferromagnetically exchange-coupled to the first pinned layer 106 through the first exchange coupling layer 108, thereby having a magnetization direction parallel to a thickness direction thereof. A thickness of the first exchange coupling layer 108 may be controlled in such a way that the second pinned layer 110 can have a perpendicular magnetization that is antiparallel to the magnetization direction of the first pinned layer 106. For example, the thickness of the first exchange coupling layer 108 may range from about 2 Å (Angstroms) to about 10 Å (Angstroms). Accordingly, the magnetization direction 110a of the second pinned layer 110 may be anti-parallel to the magnetization direction 106a of the first pinned layer 106.

The second pinned layer 110 may be formed of a magnetic material exhibiting an intrinsic in-plane magnetization property (hereinafter, referred to as an "intrinsic in-plane magnetization material"). Here, the intrinsic in-plane magnetization property means that a magnetization direction of a magnetic layer is oriented parallel to a longitudinal direction thereof when there is no external magnetic field applied thereto. For example, when a magnetic layer with the intrinsic in-plane magnetization property is formed on a substrate, a magnetization direction of the magnetic layer may be oriented substantially parallel to the top surface of the substrate 100.

In example embodiments, the intrinsic in-plane magnetization property of the second pinned layer 110 may be realized by a single-layered or multi-layered structure including at least one of cobalt, iron, and/or alloys thereof. For example, the second pinned layer 110 may be a single-layered or multi-layered structure including at least one of CoFeB, CoHf, Co, and/or CoZr. The above intrinsic in-plane magnetization materials for the second pinned layer 110 are identified to provide a better understanding of the inventive concepts, but the inventive concepts are not limited thereto.

If a specific external factor is applied to the second pinned layer 110, the magnetization direction of the second pinned layer 110 may be changed from the in-plane state to the perpendicular state. For example, the second pinned layer 110 may be formed to be in contact with the tunnel barrier TBR, and as a result of such contact, the second pinned layer 110 may have the perpendicular magnetization direction. When, for instance, the tunnel barrier TBR serves as the external factor changing the magnetization direction of the second pinned layer 110, the second pinned layer 110 may be said to have an extrinsic perpendicular magnetization property. That is, the second pinned layer 110 may be an extrinsic perpendicular magnetization structure.

Where the second pinned layer 110 is formed in contact with the tunnel barrier TBR, the second pinned layer 110 may exhibit an extrinsic perpendicular magnetization property or serve as the extrinsic perpendicular magnetization structure, due to interface anisotropy at an interface therebetween. There are various causes for the interface anisotropy. For example, where the tunnel barrier TBR includes MgO and the second pinned layer 110 includes CoFeB, the interface anisotropy may result from bonding between oxygen atoms in the tunnel barrier TBR and iron atoms in the second pinned layer 110. The bonding between oxygen and iron atoms may be enhanced when a nonmetallic element (e.g., boron) is exhausted from the second pinned layer 110 through the interface between the tunnel barrier TBR and the second pinned layer 110.

The interface anisotropy of the second pinned layer 110 may be induced by an additional thermal treatment process, which may be performed after deposition of the second pinned layer 110. For example, the second pinned layer 110 may include at least a portion having an amorphous structure, right after it is deposited, but by performing the thermal treatment process, the second pinned layer 110 may be transformed to have the extrinsic perpendicular magnetization property. During the thermal treatment process, a crystal structure of the second pinned layer 110 may be changed depending on the crystal structure of the tunnel barrier TBR. For example, where the tunnel barrier TBR has a NaCl crystal structure, the crystal structure of the second pinned layer 110 may be changed to have a body-centered cubic structure resembling the NaCl crystal structure. The lattice matching at the interface between the tunnel barrier TBR and the second pinned layer 110 may contribute to enhance a magnetoresistance ratio of the magnetic tunnel junction.

The tunnel bather TBR may include at least one of magnesium oxide, titanium oxide, aluminum oxide, magnesium-zinc oxide, magnesium-boron oxide, titanium nitride, or vanadium nitride. For example, the tunnel bather TBR may be a magnesium oxide (MgO) layer. In certain embodiments, the tunnel bather TBR may be configured to include a plurality of layers.

In example embodiments, the second magnetic structure MS2 may include a free layer 112 between the tunnel barrier TBR and the upper electrode TE, a second exchange coupling layer 114 between the free layer 112 and the upper electrode TE, and an assistant layer 116 between the second exchange coupling layer 114 and the upper electrode TE. The second magnetic structure MS2 in the present embodiment may be a multi-layered magnetic structure that is configured to include the free layer FRL of the first type of the magnetic tunnel junction MTJ1 described with reference to FIG. 4A. In this case, a magnetization direction 112a of the free layer 112 may be substantially perpendicular to the top surface of the substrate 100.

The free layer 112 may be formed of a magnetic material exhibiting the intrinsic in-plane magnetization property. In example embodiments, the intrinsic in-plane magnetization property of the free layer 112 may be realized by a single-layered or multi-layered structure including at least one of cobalt, iron, and/or alloys thereof. For example, the free layer 112 may be a single-layered or multi-layered structure including at least one of CoFeB, CoHf, Co, and/or CoZr.

Although the free layer 112 has the intrinsic in-plane magnetization property, if a specific external factor is applied to the free layer 112, the magnetization direction of the free layer 112 may be changed from the in-plane state to the perpendicular state. For example, where the free layer 112 is formed in contact with the tunnel barrier TBR, the free layer 112 may exhibit the extrinsic perpendicular magnetization property or serve as the extrinsic perpendicular magnetization structure, due to interface anisotropy at an interface therebetween.

The second exchange coupling layer 114 may include a multiferroic material having the ferroelectric and antiferromagnetic properties. Due to its ferroelectric property, the second exchange coupling layer 114 may have an electric polarization 114b, whose magnitude is finite, and whose direction can be changed by applying an external electric field thereto. Further, due to its antiferromagnetic property, magnetic moments 114a that are antiparallel to each other may be produced in the second exchange coupling layer 114, and the directions of the magnetic moments 114a may be changed using an external magnetic field applied to the second exchange coupling layer 114. Due to the magnetoelectric effect of the multiferroic material, the directions of the magnetic moments 114a may be changed by the external electric field, and the direction of the electric polarization 114b may be changed by the external magnetic field.

In example embodiments, the directions of the magnetic moments 114a may be substantially perpendicular to the top surface of the substrate 100. The direction of the electric polarization 114b may be at a specific angle θ to the directions of the magnetic moments 114a. Here, the specific angle θ may be dependent on a material constituting the second exchange coupling layer 114. In example embodiments, the specific angle θ may range from about 0° to about 90°, for example.

The magnetic moments 114a may be produced by applying an external magnetic field to the magnetic tunnel junction MTJ after forming the second exchange coupling layer 114 and the assistant layer 116 on the free layer 112. More particularly, after the second exchange coupling layer 114 and the assistant layer 116 are deposited on the free layer 112, the external magnetic field may be applied to the magnetic tunnel junction MTJ in such a way that the magnetization direction 112a of the free layer 112 becomes substantially perpendicular to the top surface of the substrate 100. Due to the presence of the external magnetic field, the magnetic moments 114a of the second exchange coupling layer 114 may be oriented to be substantially perpendicular to the top surface of the substrate 100. In this case, since the direction of the electric polarization 114b is at the specific angle (1 with respect to those of the magnetic moments 114a, the electric polarization 114b may have a specific direction arranged at the specific angle θ with respect to the magnetic moments 114a.

The second exchange coupling layer 114 may be a single-layered or multi-layered structure including at least one of the multiferroic materials having ferroelectric and antiferromagnetic properties. In example embodiments, the second exchange coupling layer 114 may include an oxide multiferroic material with a Perovskite structure. For example, the second exchange coupling layer 114 may include $BiFeO_3$ or $YMnO_3$. Where the second exchange coupling layer 114 includes $BiFeO_3$, the angle θ between the magnetic moments 114a and the electric polarization 114b may be about 90°.

The second exchange coupling layer 114 may have a bottom surface in contact with a top surface of the free layer 112 and a top surface in contact with a bottom surface of the assistant layer 116.

The electric polarization 114b of the second exchange coupling layer 114 may be changed by an external electric field, which may be produced by a voltage applied to the magnetic tunnel junction MTJ through the upper electrode TE. Accordingly, the magnetic moments 114a can also be changed, because they are arranged at the specific angle θ with respect to the electric polarization 114b. A method of changing the electric polarization 114b and the magnetic moments 114a using the voltage applied to the magnetic tunnel junction MTJ will be described below.

The assistant layer 116 may include at least one conductive metal oxide and/or metal. The assistant layer 116 may have a crystal structure similar to that of the second exchange coupling layer 114. In example embodiments, the assistant layer 116 may include materials with at least one of Perovskite, cubic, and/or tetragonal structures. For example, the assistant layer 116 may include at least one of a conductive metal oxide with a Perovskite structure (e.g., $SrRuO_3$), a metal with a face centered cubic (FCC) structure (e.g., Pt), and/or a metal with a body centered cubic (BCC) structure (e.g., W). The assistant layer 116 may contribute to grow and maintain the crystal structure of the second exchange coupling layer 114.

In example embodiments, an annealing process may be performed after the assistant layer 116 is formed on the second exchange coupling layer 114. As the result of the annealing process, the second exchange coupling layer 114 may have a crystal structure that is dependent on a crystal structure of the assistant layer 116. For example, at an interface between the second exchange coupling layer 114 and the assistant layer 116, the second exchange coupling layer 114 may have a crystal plane that is lattice-matched with that of the assistant layer 116. Due to the lattice matching at the interface, during operation of a semiconductor device including the magnetic tunnel junction MTJ, it is possible to stably maintain the crystal structure of the second exchange coupling layer 114, even when the electric polarization 114b and the magnetic moments 114a are repeatedly changed by an external electric field applied to the second exchange coupling layer 114.

In example embodiments, the assistant layer 116 may have a thickness T2 that is thicker than a thickness T1 of the second exchange coupling layer 114.

A second dielectric layer 118 may be provided on a front surface of the substrate 100 to cover the lower electrode BE, the magnetic tunnel junction MTJ, and the upper electrode TE. An upper contact plug 120 may be connected to the upper electrode TE through the second dielectric layer 118. The second dielectric layer 118 may include oxide, nitride, and/or oxynitride, and the upper contact plug 120 may, for example, include metals (e.g., titanium, tantalum, copper, aluminum or tungsten, and so forth) and/or conductive metal nitrides (e.g., titanium nitride or tantalum nitride, and so forth). The bit line BL may be provided on the second dielectric layer 118. The bit line BL may be coupled to the upper contact plug 120. The bit line BL may, for example, include metals (e.g., titanium, tantalum, copper, aluminum or tungsten, and so forth) and/or conductive metal nitrides (e.g., titanium nitride or tantalum nitride, and so forth). The bit line BL may connect a memory device including the magnetic tunnel junction MTJ to the read and write circuit 40 described with reference to FIG. 1. In other words, the memory device with the magnetic tunnel junction MTJ may be connected to the read and write circuit 40 by the bit line BL.

Figure 9A:
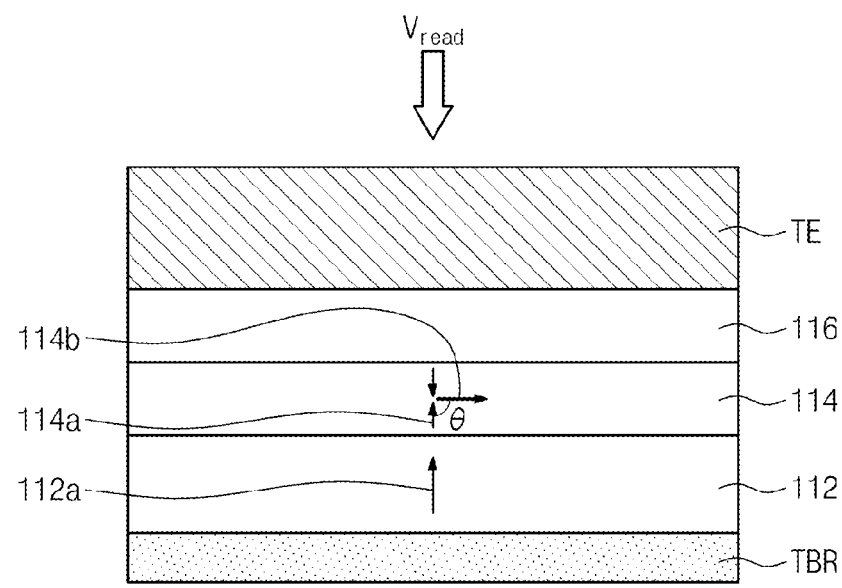
FIGS. 9A and 9B are diagrams provided to describe changes in an electric polarization and magnetic moments of a second exchange coupling layer, which are induced by a voltage applied to a magnetic tunnel junction (MTJ), in a magnetic memory device according to example embodiments of the inventive concepts.
Figure 9B:
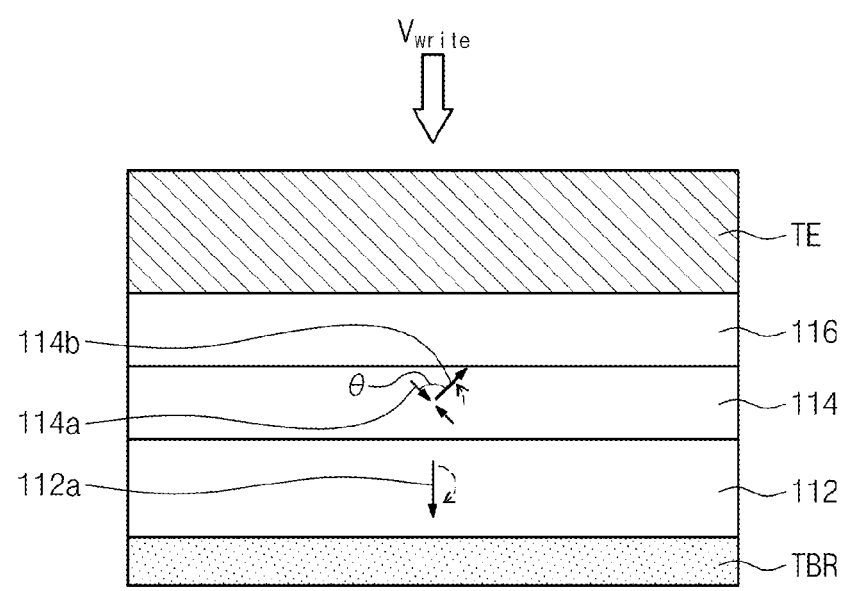

FIGS. 9A and 9B are somewhat schematic diagrams provided to describe changes in the electric polarization 114b and the magnetic moments 114a of the second exchange coupling layer 114, which are induced by a voltage applied to the magnetic tunnel junction MTJ in a magnetic memory device according to example embodiments of the inventive concepts.

As described previously with reference to FIGS. 2 and 3, the memory device ME including the magnetic tunnel junction MTJ may be connected to the read and write circuit 40 through the bit line BL. The read and write circuit 40 may apply a read voltage Vread or a write voltage Vwrite to the magnetic tunnel junction MTJ through the bit line BL and the upper electrode TE. In example embodiments, the read voltage Vread may be lower than the write voltage Vwrite.

Referring to FIG. 9A, if the read voltage Vread is applied to the magnetic tunnel junction MTJ through the upper electrode TE, the second exchange coupling layer 114 may be supplied with a first external electric field produced by the read voltage Vread. The read voltage Vread may be selected to prevent the electric polarization 114b from being changed. For example, the read voltage Vread may be about 0.05V or lower. Accordingly, during the read operation, the electric polarization 114b of the second exchange coupling layer 114 may not be changed by the first external electric field. In other words, the direction of the electric polarization 114b can remain fixed in a first direction. For example, in the case where the second exchange coupling layer 114 includes BiFeO$_3$, the first direction may be substantially parallel to the top surface of the substrate 100.

Since the electric polarization 114b is fixed in the first direction, the magnetic moments 114a may also be unchanged by the first external electric field. In other words, the magnetic moments 114a may be preserved to have a direction substantially perpendicular to the top surface of the substrate 100.

Due to the antiferromagnetic property of the second exchange coupling layer 114, the magnetic moments 114a in the second exchange coupling layer 114 may be antiparallel to each other. In other words, the magnetic moments 114a may have the same direction as, or an opposite direction to, the magnetization direction 112a of the free layer 112. In this case, the magnetization direction 112a may be exchange-coupled with one of the magnetic moments 114a, which is adjacent to the free layer 112 and is parallel to the magnetization direction 112a, and thus, the magnetization direction 112a of the free layer 112 may be fixed in a specific direction that is substantially perpendicular to the top surface of the substrate 100.

When the read voltage Vread is applied to the magnetic tunnel junction MTJ, the free layer 112 may be exchange coupled with the second exchange coupling layer 114 to have the magnetization direction 112a that is fixed to the specific direction. Accordingly, it is possible to prevent the magnetization direction 112a of the free layer 112 from being changed by the read voltage Vread.

Referring to FIG. 9B, if the write voltage Vwrite is applied to the magnetic tunnel junction MTJ through the upper electrode TE, the second exchange coupling layer 114 may be supplied with a second external electric field produced by the write voltage Vwrite. The electric polarization 114b of the second exchange coupling layer 114 may be changed by the second external electric field.

In example embodiments, the write voltage Vwrite may be higher than the read voltage Vread, and thus, a magnitude of the second external electric field applied to the second exchange coupling layer 114 by the write voltage Vwrite may be greater than that of the first external electric field applied to the second exchange coupling layer 114 by the read voltage Vread. Accordingly, when the write voltage Vwrite is applied to the magnetic tunnel junction MTJ, it is possible to change a direction of the electric polarization 114b from the first direction to a second direction that is different from the first direction. In the case where the second exchange coupling layer 114 includes BiFeO$_3$, the second direction may, for instance, be at an oblique angle to the top surface of the substrate 100.

The change in direction of the electric polarization 114b may lead to a change in directions of the magnetic moments 114a. In other words, due to the presence of the second external electric field, the directions of the magnetic moments 114a may become obliquely slanted to the top surface of the substrate 100.

As a result of the oblique orientation of the magnetic moments 114a relative to the top surface of the substrate 100, the exchange coupling between the free layer 112 and the second exchange coupling layer 114 may be decreased relative to that of FIG. 9A. This means that the magnetization direction 112a of the free layer 112 can be easily switched, for example, when the magnetic tunnel junction MTJ is applied with the write voltage Vwrite.

According to example embodiments of the inventive concepts, the memory device ME including the magnetic tunnel junction MTJ may be connected to the read and write circuit 40 through the single bit line BL. The magnetic tunnel junction MTJ may include the second exchange coupling layer 114, provided adjacent to the free layer 112 and having ferroelectric and antiferromagnetic properties.

In the case where the bit line BL is applied with the read voltage Vread, as the result of the antiferromagnetic property of the second exchange coupling layer 114, the free layer 112 may be exchange coupled with the second exchange coupling layer 114 to have the magnetization direction 112a that is fixed to a specific direction. In other words, data stability of the magnetic tunnel junction MTJ can be increased.

In the case where the bit line BL is applied with the write voltage Vwrite, the electric polarization 114b of the second exchange coupling layer 114 can be changed by the ferroelectric property of the second exchange coupling layer 114, and moreover, the magnetic moments 114a of the second exchange coupling layer 114 can also be changed by the magnetoelectric effect. The change of the magnetic moments 114a may lead to weakening of the exchange coupling between the free layer 112 and the second exchange coupling layer 114. Accordingly, data stored in the magnetic tunnel junction MTJ can be more easily changed using a reduced switching current.

In other words, the electric polarization 114b and the magnetic moments 114a of the second exchange coupling layer 114 can be controlled by voltages applied to the single bit line BL. It is therefore possible to provide a magnetic memory device in which the magnetic tunnel junction MTJ is configured to have improved data stability and an improved switching property.

Figure 6:
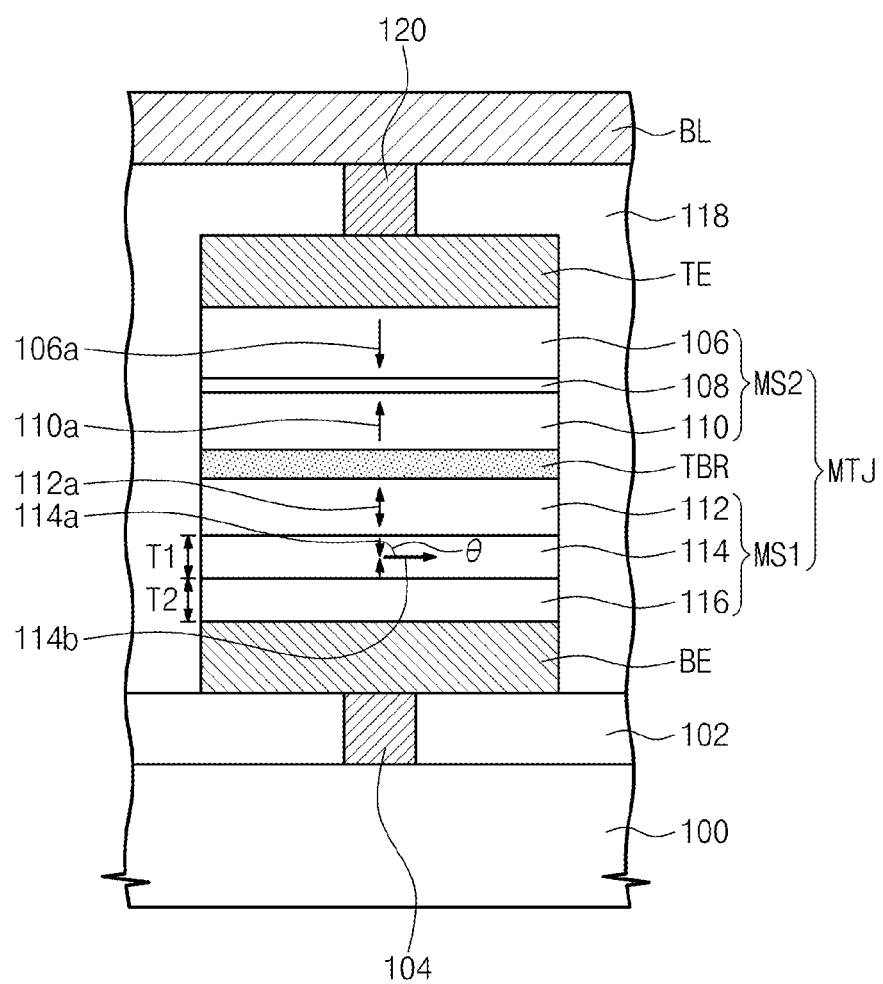
FIG. 6 is a sectional view illustrating a magnetic memory device according to modified embodiments of the inventive concepts.

FIG. 6 is a sectional view illustrating a magnetic memory device according to a modified example embodiment of the inventive concepts. For conciseness, elements previously described with reference to FIG. 5 may be identified by similar or identical reference numbers, and redundant description thereof may be omitted.

Referring to FIG. 6, the lower electrode BE, the magnetic tunnel junction MTJ, and the upper electrode TE may be sequentially stacked on the substrate 100. The magnetic tunnel junction MTJ may include the first magnetic structure MS1 provided on the lower electrode BE, the second magnetic structure MS2 provided on the first magnetic structure MS1, and the tunnel barrier TBR between the first magnetic structure MS1 and the second magnetic structure MS2.

The first magnetic structure MS1 may include the free layer 112 between the tunnel barrier TBR and the lower electrode BE, the second exchange coupling layer 114 between the free layer 112 and the lower electrode BE, and the assistant layer 116 between the second exchange coupling layer 114 and the lower electrode BE. The first magnetic structure MS1 in the present embodiment may be a multi-layered magnetic structure that is configured to include the free layer FRL of the second type of magnetic tunnel junction MTJ2 described with reference to FIG. 4B. In this case, the magnetization direction 112a of the free layer 112 may be substantially perpendicular to the top surface of the substrate 100.

Except for their positional differences, the free layer 112, the second exchange coupling layer 114, and the assistant layer 116 may be configured to have substantially the same features as those described with reference to FIG. 5, and thus a repeated description thereof will be omitted.

The direction of the electric polarization 114b of the second exchange coupling layer 114 may be changed by an external electric field, which may be produced by a voltage applied to the magnetic tunnel junction MTJ. Accordingly, the magnetic moments 114a of the second exchange coupling layer 114 can also be changed, because they are at the specific angle θ to the electric polarization 114b. The method of changing the electric polarization 114b and the magnetic moments 114a using voltages applied to the magnetic tunnel junction MTJ may be substantially the same as that described with reference to FIGS. 9A and 9B.

The second magnetic structure MS2 may include the first pinned layer 106 between the upper electrode TE and the tunnel barrier TBR, the second pinned layer 110 between the first pinned layer 106 and the tunnel barrier TBR, and the first exchange coupling layer 108 between the first pinned layer 106 and the second pinned layer 110. The second magnetic structure MS2 in the present embodiment may be a multi-layered magnetic structure that is configured to include the pinned layer PNL of the second type of magnetic tunnel junction MTJ2 described with reference to FIG. 4B. Accordingly, the first and second pinned layers 106 and 110 may have magnetization directions 106a and 110a, respectively, that are substantially perpendicular to the top surface of the substrate 100.

The second pinned layer 110 may be antiferromagnetically exchange-coupled with the first pinned layer 106 by the first exchange coupling layer 108. Except for their positional differences, the first pinned layer 106, the second pinned layer 110, and the first exchange coupling layer 108 may be configured to have substantially the same features as those described with reference to FIG. 5, and thus a repeated description thereof will be omitted.

In the present modification, the magnetic tunnel junction MTJ may be coupled to the single bit line BL through the upper electrode TE, and may be connected to the read and write circuit 40 of FIG. 1 through the single bit line BL. The electric polarization 114b and the magnetic moments 114a of the second exchange coupling layer 114 may be controlled by voltages applied to the magnetic tunnel junction MTJ through the single bit line BL. This configuration makes it possible to provide a magnetic memory device in which the magnetic tunnel junction MTJ is configured to have improved data stability and an improved switching property.

Figure 7:
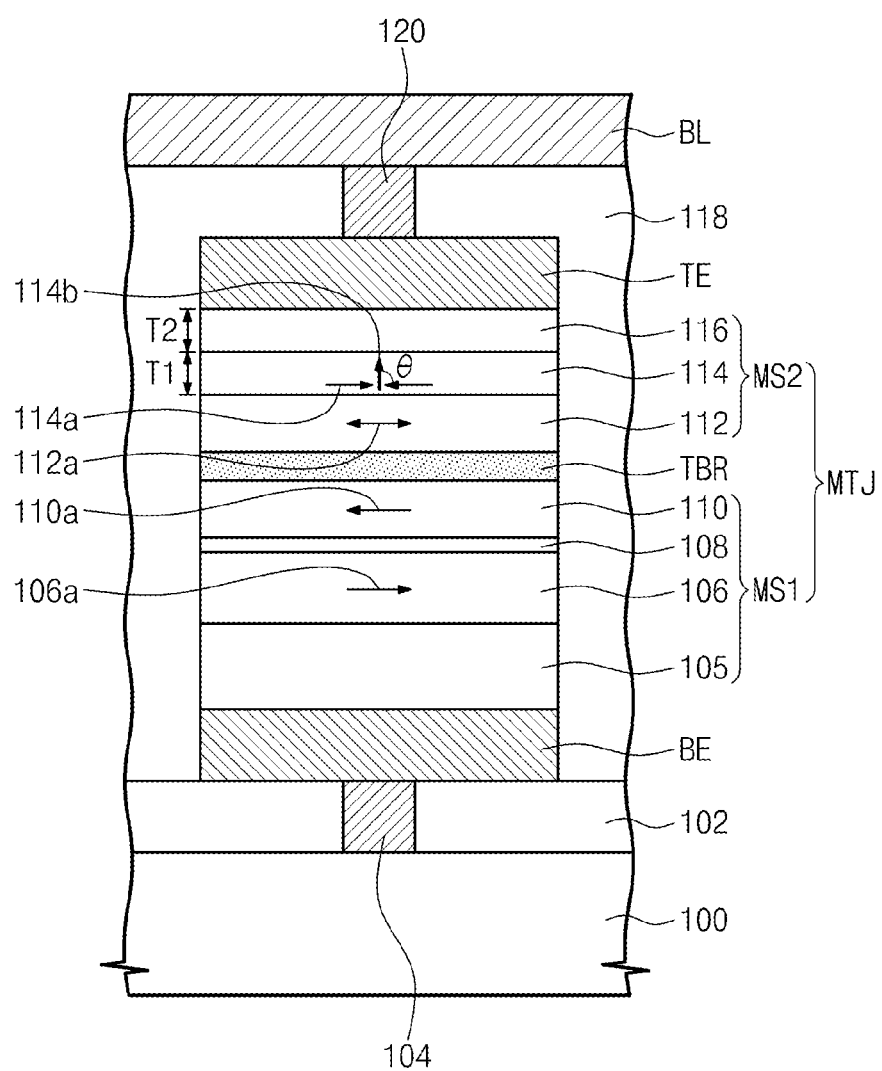
FIG. 7 is a sectional view illustrating a magnetic memory device according to other example embodiments of the inventive concepts.

FIG. 7 is a sectional view illustrating a magnetic memory device according to other example embodiments of the inventive concepts. Elements previously described with reference to FIG. 5 may be identified by similar or identical reference numbers, and redundant description thereof may be omitted.

Referring to FIG. 7, the lower electrode BE, the magnetic tunnel junction MTJ, and the upper electrode TE may be sequentially stacked on the substrate 100. The magnetic tunnel junction MTJ may include the first magnetic structure MS1 provided on the lower electrode BE, the second magnetic structure MS2 provided on the first magnetic structure MS1, and the tunnel barrier TBR between the first magnetic structure MS1 and the second magnetic structure MS2.

In the present embodiment, the first magnetic structure MS1 may include a pinning layer 105 between the lower electrode BE and the tunnel barrier TBR as well as the first pinned layer 106, the first exchange coupling layer 108, and the second pinned layer 110 sequentially stacked between the pinning layer 105 and the tunnel barrier TBR. The first pinned layer 106 may be disposed between the pinning layer 105 and the first exchange coupling layer 108, and the second pinned layer 110 may be disposed between the first exchange coupling layer 108 and the tunnel barrier TBR. The first magnetic structure MS1 in the present embodiment may be a multi-layered magnetic structure that is configured to include the pinned layer PNL of the third type of magnetic tunnel junction MTJ3 described with reference to FIG. 4C.

Accordingly, the first and second pinned layers 106 and 110, respectively, may have magnetization directions 106a and 110a, respectively, that are substantially parallel to the top surface of the substrate 100.

The magnetization direction 106a of the first pinned layer 106 may be fixed by the pinning layer 105. The first exchange coupling layer 108 may be configured to allow the first and second pinned layers 106 and 110, respectively, to be coupled with each other in such a way that the magnetization directions 106a and 110a, respectively, thereof are anti-parallel to each other.

The pinning layer 105 may include at least one antiferromagnetic material. For example, the pinning layer 105 may include at least one of platinum manganese (PtMn), iridium manganese (IrMn), manganese oxide (MnO), manganese sulfide (MnS), manganese telluride (MnTe), and/or manganese fluoride (MnF).

The first pinned layer 106 may include at least one ferromagnetic material. For example, the first pinned layer 106 may include at least one of CoFeB (cobalt-iron-boron), CoFe (cobalt-iron), NiFe (nickel-iron), CoFePt (cobalt-iron-platinum), CoFePd (cobalt-iron-palladium), CoFeCr (cobalt-iron-chromium), CoFeTb (cobalt-iron-terbium), and/or CoFeNi (cobalt-iron-nickel). The first exchange coupling layer 108 may include at least one of ruthenium (Ru), iridium (Ir), and/or rhodium (Rh). The second pinned layer 110 may include at least one ferromagnetic material. For example, the second pinned layer 110 may include at least one of CoFeB (cobalt-iron-boron), CoFe (cobalt-iron), NiFe (nickel-iron), CoFePt (cobalt-iron-platinum), CoFePd (cobalt-iron-palladium), CoFeCr (cobalt-iron-chromium), CoFeTb (cobalt-iron-terbium), and/or CoFeNi (cobalt-iron-nickel).

The tunnel barrier TBR may include at least one of magnesium oxide, titanium oxide, aluminum oxide, magnesium-zinc oxide, magnesium-boron oxide, titanium nitride, and/or vanadium nitride. For example, the tunnel barrier TBR may be a magnesium oxide (MgO) layer. In certain embodiments, the tunnel barrier TBR may be configured to include a plurality of layers.

In the present embodiment, the second magnetic structure MS2 may include the free layer 112 between the tunnel barrier TBR and the upper electrode TE, the second exchange coupling layer 114 between the free layer 112 and the upper electrode TE, and the assistant layer 116 between the second exchange coupling layer 114 and the upper electrode TE. The second magnetic structure MS2 in the present embodiment may be a multi-layered magnetic structure that is configured to include the free layer FRL of the third type of magnetic tunnel junction MTJ3 described with reference to FIG. 4C. Accordingly, a magnetization direction 112a of the free layer 112 may be substantially parallel to the top surface of the substrate 100.

The free layer 112 may be formed of a ferromagnetic material including at least one of cobalt (Co), iron (Fe), and/or nickel (Ni). For example, the free layer 112 may include CoFeB, CoFe, and/or CoFeNi.

The second exchange coupling layer 114 may include a multiferroic material having the ferroelectric and antiferromagnetic properties. Due to its ferroelectric property, the second exchange coupling layer 114 may have an electric polarization 114b, whose magnitude is finite, and whose direction can be changed by applying an external electric field thereto. Further, due to its antiferromagnetic property, antiparallel magnetic moments 114a may be produced in the second exchange coupling layer 114, and the directions of the magnetic moments 114a may be changed using an external magnetic field applied to the second exchange coupling layer 114. Due to the magnetoelectric effect of the multiferroic material, the directions of the magnetic moments 114a may be changed by the external electric field, and the direction of the electric polarization 114b may be changed by the external magnetic field.

In the present embodiment, the magnetic moments 114a may be substantially parallel to the top surface of the substrate 100. The direction of the electric polarization 114b may be at a specific angle θ to the directions of the magnetic moments 114a. Here, the specific angle θ may be dependent on a material constituting the second exchange coupling layer 114. In example embodiments, the specific angle θ may, for example, range from about 0° to about 90°.

The magnetic moments 114a, whose directions are substantially parallel to the top surface of the substrate 100, may be produced by applying an external magnetic field to the magnetic tunnel junction MTJ, after forming the second exchange coupling layer 114 and the assistant layer 116 on the free layer 112. More particularly, after the second exchange coupling layer 114 and the assistant layer 116 are deposited on the free layer 112, the external magnetic field may be applied to the magnetic tunnel junction MTJ in such a way that the magnetization direction 112a of the free layer 112 becomes substantially parallel to the top surface of the substrate 100. Due to the presence of the external magnetic field, the magnetic moments 114a of the second exchange coupling layer 114 may be oriented substantially parallel to the top surface of the substrate 100. In this case, since the direction of the electric polarization 114b is at the specific angle θ to the directions of the magnetic moments 114a, the electric polarization 114b may have a specific direction that is at the specific angle θ with respect to the magnetic moments 114a.

The second exchange coupling layer 114 may be a single-layered or multi-layered structure including at least one multiferroic material with ferroelectric and antiferromagnetic properties. For example, the second exchange coupling layer 114 may include $BiFeO_3$, and in this case, the angle θ between the magnetic moments 114a and the electric polarization 114b may be about 90°.

The second exchange coupling layer 114 may have a bottom surface in contact with a top surface of the free layer 112, and a top surface in contact with a bottom surface of the assistant layer 116.

The electric polarization 114b of the second exchange coupling layer 114 may be changed by an external electric field, which may be produced by a voltage applied to the magnetic tunnel junction MTJ through the upper electrode TE. Accordingly, the magnetic moments 114a can also be changed, because they are at the specific angle θ to the electric polarization 114b. A method of changing the electric polarization 114b and the magnetic moments 114a using the voltage applied to the magnetic tunnel junction MTJ will be described below.

The assistant layer 116 may include at least one of conductive metal oxides and/or metals. The assistant layer 116 may, for example, include a material whose crystal structure is similar to that of the second exchange coupling layer 114. The assistant layer 116 may be configured to contribute to the growing and preserving of the crystal structure of the second exchange coupling layer 114. The thickness T2 of the assistant layer 116 may be greater than the thickness T1 of the second exchange coupling layer 114.

The second dielectric layer 118 may be provided on the front surface of the substrate 100 to cover the lower electrode BE, the magnetic tunnel junction MTJ, and the upper electrode TE. The upper contact plug 120 may be connected to the upper electrode TE through the second dielectric layer 118. The bit line BL may be provided on the second dielectric layer 118. The bit line BL may be coupled to the upper contact plug 120. The bit line BL may connect a memory device including the magnetic tunnel junction MTJ to the read and write circuit 40 described previously with reference to FIG. 1.

Figure 10A:
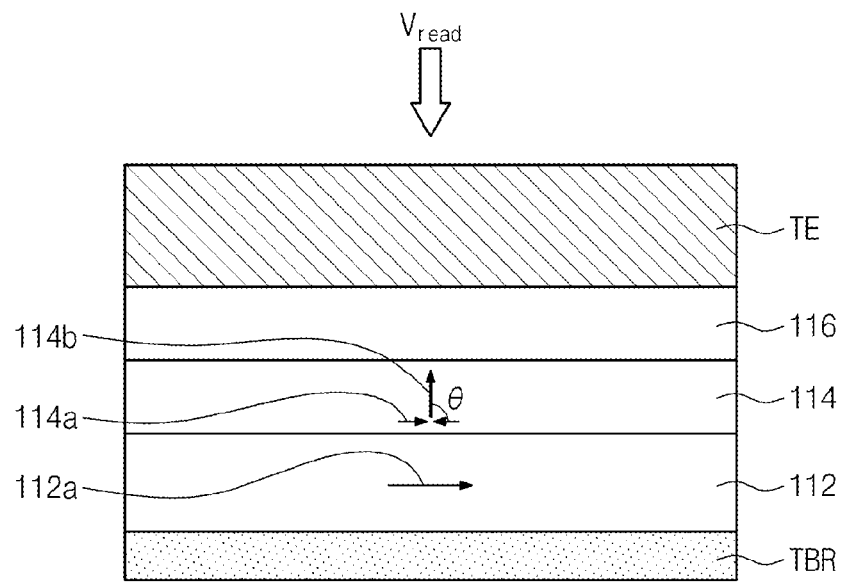
FIGS. 10A and 10B are diagrams provided to describe changes in an electric polarization and magnetic moments of a second exchange coupling layer, which are induced by a voltage applied to a magnetic tunnel junction (MTJ), in a magnetic memory device according to other example embodiments of the inventive concepts.
Figure 10B:
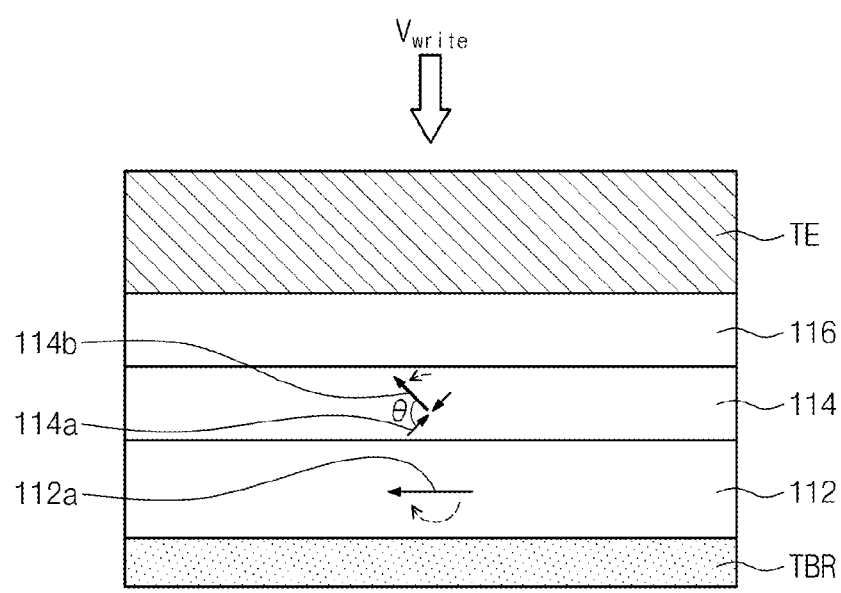

FIGS. 10A and 10B are diagrams provided to describe changes in the electric polarization 114b and the magnetic moments 114a of the second exchange coupling layer 114, which are induced by a voltage applied to a magnetic tunnel junction MTJ, in a magnetic memory device according to other example embodiments of the inventive concepts.

As described with reference to FIGS. 2 and 3, the memory device ME including the magnetic tunnel junction MTJ may be connected to the read and write circuit 40 through the bit line BL. The read and write circuit 40 may apply a read voltage Vread or a write voltage Vwrite to the magnetic tunnel junction MTJ through the bit line BL and the upper electrode TE. In example embodiments, the read voltage Vread may be lower than the write voltage Vwrite.

Referring to FIG. 10A, if the read voltage Vread is applied to the magnetic tunnel junction MTJ through the upper electrode TE, the second exchange coupling layer 114 may be supplied with a first external electric field produced by the read voltage Vread. The read voltage Vread may be selected to prevent the electric polarization 114b from being changed. Accordingly, the electric polarization 114b of the second exchange coupling layer 114 may not be changed by the first external electric field. In other words, the direction of the electric polarization 114b can be fixed in a first direction. For example, where the second exchange coupling layer 114 includes $BiFeO_3$, the first direction may be substantially perpendicular to the top surface of the substrate 100.

Since the electric polarization 114b is fixed in the first direction, the magnetic moments 114a may also be unchanged by the first external electric field. In other words, the magnetic moments 114a may be preserved to have a direction substantially parallel to the top surface of the substrate 100.

Due to the antiferromagnetic property of the second exchange coupling layer 114, the magnetic moments 114a in the second exchange coupling layer 114 may be antiparallel to each other. In other words, the magnetic moments 114a may have the same direction as, or an opposite direction to, the magnetization direction 112a of the free layer 112. In this case, the magnetization direction 112a may be exchange-coupled with one of the magnetic moments 114a, which is adjacent to the free layer 112 and is parallel to the magnetization direction 112a, and thus, the magnetization direction 112a of the free layer 112 may be fixed in a specific direction, which is substantially parallel to the top surface of the substrate 100.

In the case where the read voltage Vread is applied to the magnetic tunnel junction MTJ, the free layer 112 may be exchange coupled with the second exchange coupling layer 114 to have the magnetization direction 112a that is fixed in the specific direction. Accordingly, it is possible to prevent the magnetization direction 112a of the free layer 112 from being changed by the read voltage Vread.

Referring to FIG. 9B, if the write voltage Vwrite is applied to the magnetic tunnel junction MTJ through the upper electrode TE, the second exchange coupling layer 114 may be supplied with a second external electric field produced by the write voltage Vwrite. The electric polarization 114b of the second exchange coupling layer 114 may be changed by the second external electric field.

In example embodiments, the write voltage Vwrite may be higher than the read voltage Vread, and thus, a magnitude of the second external electric field applied to the second exchange coupling layer 114 by the write voltage Vwrite may be greater than that of the first external electric field applied to the second exchange coupling layer 114 by the read voltage Vread. Accordingly, when the write voltage Vwrite is applied to the magnetic tunnel junction MTJ, it is possible to change a direction of the electric polarization 114b from the first direction to a second direction that is different from the first direction. For example, if the second exchange coupling layer 114 includes $BiFeO_3$, the second direction may be at an oblique angle to the top surface of the substrate 100.

The change in direction of the electric polarization 114b may lead to a change in directions of the magnetic moments 114a. In other words, due to the presence of the second external electric field, the directions of the magnetic moments 114a may become obliquely slanted to the top surface of the substrate 100.

As a result of the oblique orientation of the magnetic moments 114a relative to the top surface of the substrate 100, the exchange coupling between the free layer 112 and the second exchange coupling layer 114 may be decreased relative to that of FIG. 10A. This means that the magnetization direction 112a of the free layer 112 can be more easily switched when the magnetic tunnel junction MTJ is supplied with the write voltage Vwrite.

Figure 8:
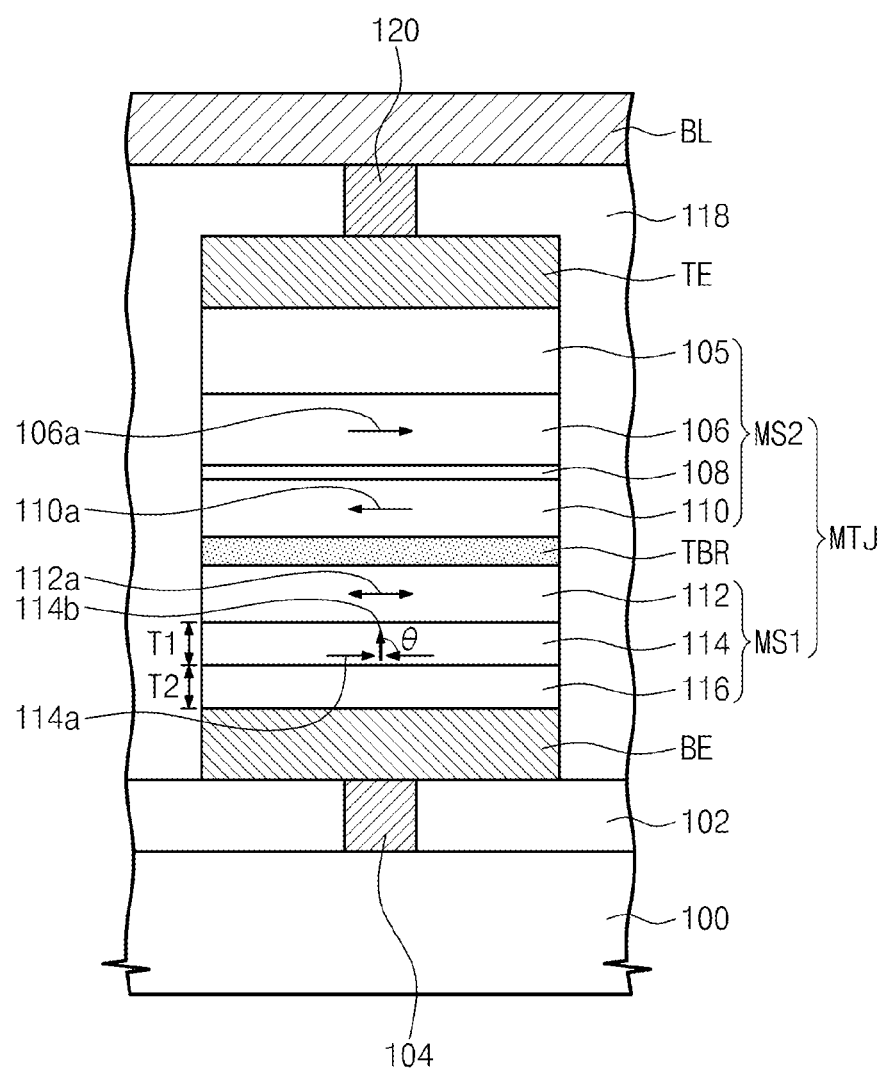
FIG. 8 is a sectional view illustrating a magnetic memory device according to modifications of other example embodiments of the inventive concepts.

FIG. 8 is a sectional view illustrating a magnetic memory device according to other example embodiments of the inventive concepts. For brevity, elements previously described with reference to FIG. 7 may be represented by similar or identical reference numbers and redundant description thereof may be omitted.

Referring to FIG. 8, the lower electrode BE, the magnetic tunnel junction MTJ, and the upper electrode TE may be sequentially stacked on the substrate 100. The magnetic tunnel junction MTJ may include the first magnetic structure MS1 provided on the lower electrode BE, the second magnetic structure MS2 provided on the first magnetic structure MS1, and the tunnel barrier TBR between the first magnetic structure MS1 and the second magnetic structure MS2.

The first magnetic structure MS1 may include the free layer 112 between the tunnel bather TBR and the lower electrode BE, the second exchange coupling layer 114 between the free layer 112 and the lower electrode BE, and the assistant layer 116 between the second exchange coupling layer 114 and the lower electrode BE. The first magnetic structure MS1 in the present embodiment may be a multi-layered magnetic structure that is configured to include the free layer FRL of the fourth type of magnetic tunnel junction MTJ4 described with reference to FIG. 4D. Accordingly, the magnetization direction 112a of the free layer 112 may be substantially parallel to the top surface of the substrate 100.

Except for their positional differences, the free layer 112, the second exchange coupling layer 114, and the assistant layer 116 may be configured to have substantially the same features as those described with reference to FIG. 7, and thus a redundant description thereof will be omitted. The method of changing the electric polarization 114b and the magnetic moments 114a of the second exchange coupling layer 114 using voltages applied to the magnetic tunnel junction MTJ may be substantially the same as that described previously with reference to FIGS. 10A and 10B.

The second magnetic structure MS2 may include a pinning layer 105 between the upper electrode TE and the tunnel barrier TBR, as well as a first pinned layer 106, a first exchange coupling layer 108, and a second pinned layer 110 sequentially stacked between the pinning layer 105 and the tunnel barrier TBR. The first pinned layer 106 may be disposed between the pinning layer 105 and the first exchange coupling layer 108, and the second pinned layer 110 may be disposed between the first exchange coupling layer 108 and the tunnel barrier TBR. The second magnetic structure MS2 in the present embodiment may be a multi-layered magnetic structure that is configured to include the pinned layer PNL of the fourth type of magnetic tunnel junction MTJ4 described with reference to FIG. 4D. Accordingly, the first and second pinned layers 106 and 110, respectively, may have magnetization directions 106a and 110a, respectively, that are substantially parallel to the top surface of the substrate 100.

Except for their positional differences, the pinning layer 105, the first pinned layer 106, the first exchange coupling layer 108, and the second pinned layer 110 may be configured having substantially the same features as those described previously, and thus a repeated detailed description thereof will be omitted.

According to example embodiments of the inventive concepts, the memory device ME including the magnetic tunnel junction MTJ may be connected to the read and write circuit 40 through the single bit line BL. The magnetic tunnel junction MTJ may include the second exchange coupling layer 114, which is provided adjacent to the free layer 112 and has the ferroelectric and antiferromagnetic properties. Since the electric polarization 114b and the magnetic moments 114a of the second exchange coupling layer 114 can be controlled by voltages applied to the single bit line BL, it is possible to provide a magnetic memory device in which the magnetic tunnel junction MTJ is configured to have improved data stability and improved switching properties.

Figure 11:
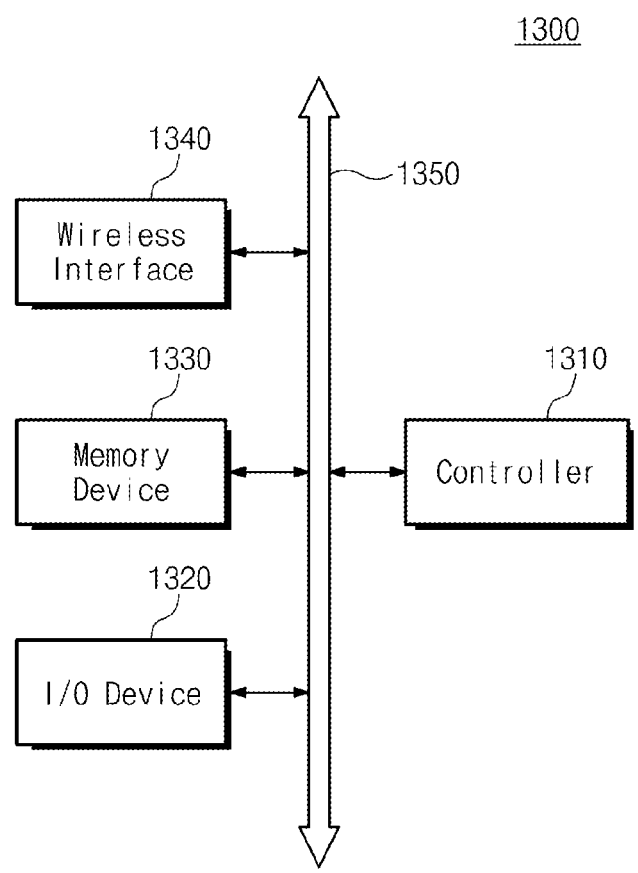
FIGS. 11 and 12 are block diagrams schematically illustrating electronic devices including a semiconductor device according to example embodiments of the inventive concepts.
Figure 12:
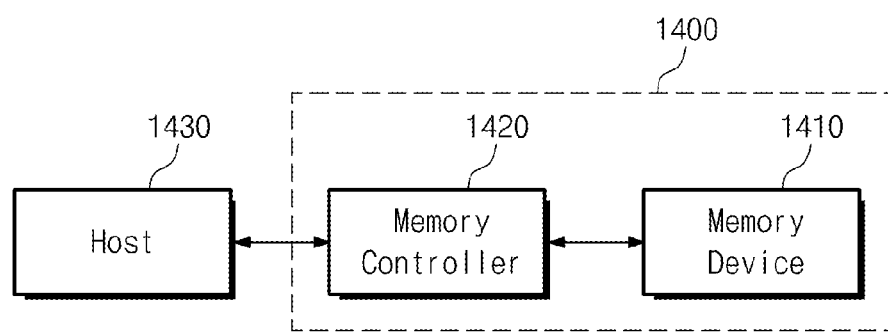

FIGS. 11 and 12 are block diagrams schematically illustrating electronic devices including a semiconductor device according to example embodiments of the inventive concepts.

Referring to FIG. 11, an electronic device 1300 including a semiconductor device according to example embodiments of the inventive concepts may be used in a personal digital assistant (PDA), a laptop computer, a mobile computer, a web tablet, a wireless phone, a cell phone, a digital music player, a wired or wireless electronic device, or a complex electronic device including a combination of such functionalities, for example. The electronic device 1300 may include a controller 1310, an input/output device(s) 1320 (such as a keypad, a keyboard, a display, etc.), a memory 1330, and/or a wireless interface 1340 that are connected/coupled to each other through a bus 1350. The controller 1310 may include, for example, at least one microprocessor, a digital signal processor, a microcontroller, etc. The memory 1330 may be configured to store a command code to be used by the controller 1310 and/or user data. The memory 1330 may include a semiconductor device according to example embodiments of inventive concepts. The electronic device 1300 may use a wireless interface 1340 configured to transmit data to, and/or receive data from, a wireless communication network using a RF (radio frequency) signal. The wireless interface 1340 may include, for example, an antenna, a wireless transceiver, etc. The electronic system 1300 may be used in a communication interface protocol of a communication system according to a standard such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

Referring to FIG. 12, a memory system including a semiconductor device according to example embodiments of inventive concepts will be described. The memory system 1400 may include a memory device 1410 for storing relatively large quantities of data, and a memory controller 1420. The memory controller 1420 controls the memory device 1410 so as to read data stored in the memory device 1410 and/or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of inventive concepts.

The semiconductor memory devices disclosed above may be encapsulated using various and diverse packaging techniques. For example, semiconductor memory devices according to the aforementioned embodiments may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

While example embodiments of the inventive concepts have been particularly shown and described, it will be understood by one of ordinary skill in the art that variations in form and detail may be made therein without departing from the spirit and scope of the attached claims.

What is claimed is:

1. A magnetic memory device, comprising:
   a plurality of variable resistance devices connected to a word line; and
   a plurality of bit lines, each of which provides an electrical pathway between a corresponding one of the variable resistance devices and a read and write circuit, wherein each of the variable resistance devices comprises:
   a free layer and a pinned layer spaced apart from each other and having a tunnel barrier interposed therebetween;
   an assistant layer spaced apart from the tunnel barrier and having the free layer interposed therebetween; and
   an exchange coupling layer between the free layer and the assistant layer, wherein the exchange coupling layer has an electric polarization resulting from its ferroelectric property, wherein the electric polarization is fixed in a direction by applying a read voltage through a corresponding one of the bit lines, and is changed to have a second direction that is different from the first direction and is at an oblique angle with respect to a top surface of the free layer by applying a write voltage through a corresponding one of the bit lines, and wherein the write voltage is greater than the read voltage.

2. The magnetic memory device of claim 1, wherein the exchange coupling layer has magnetic moments resulting from its antiferromagnetic property, and wherein a direction of the magnetic moments is fixed in a third direction by applying the read voltage through the corresponding one of the bit lines, and is changed to have a fourth direction that is different than the third direction and is at an oblique angle with respect to the top surface of the free layer by applying the write voltage through the corresponding one of the bit lines.

3. The magnetic memory device of claim 2, wherein the third direction is parallel with a magnetization direction of the free layer.

4. The magnetic memory device of claim 1, wherein the exchange coupling layer comprises a multiferroic material with ferroelectric and antiferromagnetic properties.

5. The magnetic memory device of claim 4, wherein the exchange coupling layer comprises BiFeO3.

6. The magnetic memory device of claim 1, wherein each of the variable resistance devices further comprises an electrode layer spaced apart from the exchange coupling layer and having the assistant layer interposed therebetween, and wherein the assistant layer comprises at least one of a conductive metal oxide or metal.

7. The magnetic memory device of claim 6, wherein the exchange coupling layer comprises an oxide multiferroic material with a Perovskite structure, and wherein the assistant layer comprises at least one of a conductive metal oxide with a Perovskite structure, a metal with a face centered cubic structure, or a metal with a body centered cubic structure.

8. The magnetic memory device of claim 7, wherein the assistant layer comprises at least one of SrRuO3, Pt, or W.

9. The magnetic memory device of claim 1, wherein the assistant layer has a thickness larger than that of the exchange coupling layer.

10. The magnetic memory device of claim 1, wherein the exchange coupling layer has opposing surfaces that are in contact with the free and assistant layers, respectively.

11. The magnetic memory device of claim 1, wherein each of the variable resistance devices is provided on a substrate, and wherein each of the free and pinned layers has a magnetization direction substantially perpendicular to a top surface of the substrate.

12. The magnetic memory device of claim 11, wherein the first direction is parallel to the top surface of the substrate and the second direction is at an oblique angle with respect to the top surface of the substrate.

13. The magnetic memory device of claim 1, wherein each of the variable resistance devices is provided on a substrate, and wherein each of the free and pinned layers has a magnetization direction substantially parallel to a top surface of the substrate.

14. The magnetic memory device of claim 13, wherein the first direction is perpendicular to the top surface of the substrate and the second direction is at an oblique angle with respect to the top surface of the substrate.

15. A magnetic memory device, said magnetic memory device comprising:

a magnetic tunnel junction comprising a first magnetic structure and a second magnetic structure separated from each other by a tunnel barrier, wherein either the first magnetic structure or the second magnetic structure comprises a free layer configured to change magnetic directions when a magnetic field having a sufficient strength is applied thereto;

an assistant layer arranged proximal to the free layer; and an exchange coupling layer arranged between the free layer and the assistant layer, wherein the exchange coupling layer has an electric polarization having a direction that is arranged at an angle with respect to a magnetic moment of the exchange coupling layer, wherein the magnetic moment is produced by applying an external magnetic field to the magnetic memory device after forming the exchange coupling layer, and wherein the direction of the electric polarization can be changed by a sufficient voltage applied to the magnetic tunnel junction.

16. The magnetic memory device of claim 15, wherein the electric polarization has a first direction, and wherein, when a write voltage is applied to the magnetic tunnel junction, the electric polarization is changed to have a second direction that is different from the first direction and that is neither parallel nor perpendicular to a top surface of the free layer.

17. The magnetic memory device of claim 15, wherein the exchange coupling layer has a plurality of magnetic moments, and wherein directions of the magnetic moments can be changed by a voltage applied to the magnetic tunnel junction.

18. A magnetic memory device, said magnetic memory device comprising:

a first electrode arranged to contact a bit line;

a second electrode arranged to contact a substrate;

a magnetic tunnel junction arranged between the first electrode and the second electrode, said magnetic tunnel junction comprising a first magnetic structure and a second magnetic structure separated from each other by a tunnel barrier, wherein either the first magnetic structure or the second magnetic structure comprises a free layer configured to change magnetic directions when a write voltage is applied to the bit line;

an assistant layer arranged proximal to the free layer; and an exchange coupling layer arranged between the free layer and the assistant layer, wherein the exchange coupling layer has a magnetic moment having a direction and an electric polarization having a direction, wherein the direction of the electric polarization is arranged at an angle of about 90 degrees with respect to the direction of the magnetic moment, and wherein the directions of the magnetic moment and the electric polarization can be changed by the write voltage applied to the bit line.

19. The magnetic memory device of claim 18, wherein the exchange coupling layer has a plurality of magnetic moments having a plurality of directions, and wherein directions of the magnetic moments can be changed by a voltage applied to the magnetic tunnel junction.

* * * * *